United States Patent [19]

Tanaka et al.

[11] Patent Number: 4,990,981
[45] Date of Patent: Feb. 5, 1991

[54] THIN FILM TRANSISTOR AND A LIQUID CRYSTAL DISPLAY DEVICE USING SAME

[75] Inventors: Yasuo Tanaka, Koganei; Haruo Matsumaru, Tokyo; Hideaki Yamamoto, Tokorozawa; Toshihisa Tsukada, Musashino; Ken Tsutsui, Tokyo; Yoshiyuki Kaneko, Hachioji, all of Japan

[73] Assignee: Hitachi, Ltd., Tokyo, Japan

[21] Appl. No.: 296,811

[22] Filed: Jan. 13, 1989

[30] Foreign Application Priority Data

Jan. 29, 1988 [JP] Japan .................... 63-17074

[51] Int. Cl.$^5$ ................ H01L 29/78; H01L 27/10
[52] U.S. Cl. ...................... 357/23.7; 357/4; 357/30
[58] Field of Search .................. 357/23.7, 4, 30

[56] References Cited

FOREIGN PATENT DOCUMENTS

| 60-17962 | 1/1985 | Japan | 357/4 |
| 61-3118 | 1/1986 | Japan | 357/4 |
| 61-90188 | 5/1986 | Japan | 357/4 |
| 61-145869 | 7/1986 | Japan | 357/4 |
| 62-152172 | 7/1987 | Japan | 357/4 |

Primary Examiner—Jerome Jackson, Jr.
Attorney, Agent, or Firm—Antonelli, Terry, Stout & Kraus

[57] ABSTRACT

A thin film transistor is disclosed, which comprises a gate electrode, a gate insulating layer, a semiconductor layer, a source electrode, and a drain electrode, which are disposed on a predetermined substrate, and which is so constructed that the semiconductor layer doesn't exist in any regions, to which strong electric field parallel to said substrate is applied. Besides this thin film transistor a liquid crystal display device using it is disclosed. The thin film transistor according to the present invention has a small increase in the off level current due to photo-current and it is suitable for driving pixels in the liquid crystal display device.

20 Claims, 8 Drawing Sheets

THIN FILM TRANSISTOR AND A LIQUID CRYSTAL DISPLAY DEVICE USING SAME

BACKGROUND OF THE INVENTION

The present invention relates to a thin film transistor (hereinbelow abbreviated to TFT) used in an active matrix liquid crystal display device, etc. and in particular to the construction of the TFT useful for preventing an increase in off-level current due to photo-current without increasing the capacitance between the source and the gate.

Heretofore, in order to prevent an increase in off-level current due to photo-current in a TFT using amorphous silicon (hereinbelow abbreviated to a-Si) as a semiconductor layer, there has been adopted a method (1) by which a semiconductor layer pattern is formed dimensioned so as to be enclosed completely inside of a gate electrode pattern, as disclosed in JP-A-No. 60-17962, and a method (2) by which the semiconductor layer is very thin (a layer thickness smaller than 100 nm is chosen) so that light absorbed by the semiconductor layer is reduced as far as possible, in order to prevent generation of the photo-current, as disclosed in JP-A-No. 61-90188, JP-A-No. 61-145869 or JP-A-No. 62-152172.

However, the structure of the TFT disclosed in the prior art method (1) described above gives rise to an increase in the overlapping capacitance between the gate electrode and the source electrode and between the gate electrode and the drain electrode. Such a TFT, in which overlapping capacitance, i.e. stray capacitance, is increased, has not only resulted in the problem of reducing the working speed when it is used as a single device but also another problem that in the case where the TFT is used in an active matrix liquid crystal display panel, scanning signal pulses leak to picture cell (pixel) electrodes and a DC component thereof is applied to the liquid crystal which gives rise to a burning phenomena of display pixels. Further, since the semiconductor layer pattern is enclosed (overlapped) completely by the gate electrode pattern, the semiconductor layer pattern is not formed over the step portion at the periphery of the gate electrode pattern. That is, the semiconductor layer pattern doesn't override the step portion of the pattern of the gate electrode. For this reason, this TFT has a drawback that an interlayer short circuit and an increase in leak current between the gate electrode and the source electrode or between the gate electrode and the drain electrode may likely develop with respect to a TFT having a structure, in which the semiconductor layer pattern overrides the step portion of the pattern of the gate electrode, i.e. a structure, in which the semiconductor layer is formed so as to override the step portion of the gate electrode pattern. As described above, the TFT according to the prior art technique (1) has a problematical point, when an application thereof in an active matrix liquid crystal display is considered.

On the other hand the prior art method (2) described above is a method, by which the thickness of the semiconductor layer made of e.g. hydrogenated amorphous silicon (hereinbelow abbreviated to a-Si:H(i)) is reduced to a very small value, which is as small as several tens of nm. In this way the amount of light absorbed by the a-Si:H(i) layer is reduced and thus the number of generated photo-carriers is decreased. As a result, it is possible to suppress increase in the off level current in the TFT due to irradiation with light. Usually, when the thickness of the a-Si:H(i) layer falls below 100 nm, the suppression of the off level current begins to take effect and when this thickness is reduced to a value of about 15 to 20 nm, the off level current is decreased to a value, which is so small that irradiation thereof with light of about 50,000 lx gives rise to no problem (about $10^{12}$ Ω calculated in terms of the off resistance). However, for fabricating a TFT using an a-Si:H(i) layer of about 15 to 20 nm, there is a problem in fabrication steps therefor. That is, when the thickness t of the a-Si:H(i) layer is considerably small, it is difficult to have a margin in view of the fabrication process and therefore there is a problem that fabrication yield is lowered.

In order to remove the problematical points described above, there is known a method as disclosed in JP-A-No. 61-90188, JP-A-No. 61-145869 and JP-A-No. 62-152172, by which an SiN gate insulating layer, a very thin a-Si:H(i) layer and an SiN channel protecting layer are formed one after another by the plasma CVD method; after having etched selectively the SiN channel protecting layer by the photolithographic method, an a-Si:H(n+) layer is deposited again by the plasma CVD method; and then a TFT is formed by forming island-shaped patterns of a-Si:H(i) and (n+) forming the source and the drain electrodes and etching the channel portion of the a-Si:H(n+). According to this method, since the a-Si:H(n+) on the SiN channel protecting layer, even if it is overetched, the a-Si:H(i) layer is not influenced. However, this method has drawbacks in that the fabrication steps are lengthened and as a result thereof there is a rise in the production cost.

SUMMARY OF THE INVENTION

An object of the present invention is to provide a TFT, which can solve the problems of the prior art techniques described above; does not result in an increase in the stray capacitance as well as increase in the gate leakage current; it is not difficult to manufacture since it does not require complicated fabrication steps; and has only a slight increase in the off level current due to photo-current.

Another object of the present invention is to provide a liquid crystal display panel using the TFT stated above.

In order to achieve the first object, the TFT according to the present invention is so constructed that it has a semiconductor layer in a region where separation of photo-carriers generated by the irradiation with light does not take place, i.e. in a photo-dead region, and also there exist no semiconductor layers in a region, where separation of photo-carriers takes place, i.e. photo-active region. From another point of view, paying attention to electric field strength (potential gradient) generated in the horizontal direction (direction parallel to the base plate), it is so constructed that it has a semiconductor layer in a region, where there exists almost no electric field in the horizontal direction, i.e., there exists only a very weak electric field, and, furthermore, it has no semiconductor layers in a region, where there exists a strong electric field in the horizontal direction. Further, from still another point of view, with respect to the off level current, the region, where the semiconductor layer is formed, is so defined that the off level current intensity is lower than $10^{-11}$ Amperes even at the irradiation with light.

An example of the disclosure of more concrete means will be explained, referring to drawings.

FIGS. 1a and 2a are plan views illustrating the construction of 2 different TFTs according to the present invention. The latter figure indicates a pixel portion in a liquid crystal display device around a TFT. FIGS. 3 and 4 are plan views illustrating the prior art construction of 2 different TFTs (construction according to the prior art technique (2)) for comparison with the present invention. In the figures, reference numeral 1 is a gate electrode pattern; 2 is a semiconductor layer pattern; 3 is a source electrode pattern; 4 is a drain electrode pattern; and 5 indicates pixel electrodes of an active matrix type liquid crystal display driven by the TFT stated above, which are connected electrically with the source electrode of the TFT. A-Si:H(i) is used usually for the semiconductor layer stated above, but other materials, e.g. CdSe, etc. may be used therefor. Further the semiconductor layer stated above may be thicker than 100 nm and it is not necessary for it to be very thin as in the case of the prior art technique (2) described above.

In FIGS. 1a and 2a, the semiconductor layer pattern 2 is formed inside and outside of the region of the gate electrode pattern 1 and the TFTs indicated therein are characterized in that they have a plan construction, in which the pattern of the semiconductor layer between the source and the drain electrode pattern 3 and 4, stated above, is formed within a plan region, which the gate, the source and the drain electrodes form.

The plan structure of the semiconductor layer pattern in the TFT according to the present invention has the following distinguishing features with respect to the plan structure of the semiconductor layer pattern in the TFT indicated in FIG. 3 or 4 according to the prior art techniques.

That is, the a-Si:H(i) pattern 2 formed as the semiconductor layer in the TFT according to the present invention is one in which at least hatched regions A, B, C and D the prior art TFT, as indicated in FIGS. 3 and 4. In other words, the a-Si:H(i) pattern between the source and the drain electrodes is constructed in the plan view so as to be included within a pattern obtained by synthesizing the gate, the source and the drain electrodes. Consequently cross-sectional views along the X-X' and the Y-Y' lines in FIGS. 1a and 2a can be represented by FIGS. 1b and 2b, respectively and cross-sectional views along the Z-Z' lines can be represented by FIGS. 1c and 2c, respectively. At this time, it is not necessary to remove the parts, which protrude from the gate electrode 1 in the a-Si:H(i) pattern 2 and which are covered by the source and the drain electrodes 3 and 4, i.e. hatched regions I and II. Further, in FIG. 4, it is not necessary to remove the protruding parts of the a-Si:H(i) pattern 2, which are not covered by the source electrode 3 or by the drain electrode 4 and which don't belong to the region between the source and the drain, i.e. hatched regions E and F.

Hereinbelow the reason why the off level current due to photo-current is suppressed, according to the present invention, is by distinguishing the region, where the semiconductor layer is to be formed, from the region, where it is not to be formed (i.e. it should be removed), as described above.

In the TFTs having the prior art structure indicated in FIGS. 3 and 4, the parts in the a-Si:H(i) pattern 2 protruding from the gate electrode 1 are outside of the patterns of both the source and drain electrode regions and are divided into hatched regions A, B, C, D, E, F, and those which are outside of the gate electrode but are within the pattern 2 are divided into hatched regions I and II. The degree of the contribution to the photo-current has been studied by irradiating separately each of the regions with a spot light from the gate electrode side, while varying the applied voltage between the source and the drain. As the result, it has been found that the hatched regions of the a-Si:H(i) pattern between the source and the drain, indicated by A, B, C and D, which are not covered by the source, the drain and the gate electrodes, contribute to the photo-current as photo-active regions and that the other hatched regions I, II, E and F hardly contribute to the photo-current (about 1/30–1/200).

Now it will be explained, referring to drawings, that the regions A, B, C and D are photo-active regions stated above contributing to the photo-current ($I_{ph}$) and that the regions I, II, E and F are photo-dead regions, which don't contribute to the photo-current ($I_{ph}$).

FIG. 5 is a cross-sectional view of the TFT stated above for explaining the outline of the mechanism, by which the regions A, B, C and D contribute to the photo-current ($I_{ph}$). In FIG. 5, the source electrode is grounded; +10 V is applied to the drain electrode; and −5 to −20 V is applied to the gate electrode. These voltages applied to the electrodes represent a typical example therefor, in the case where the TFT is used in a liquid crystal display panel. A hole channel 14 is formed in the a-Si:H layer, which is the semiconductor layer, above the gate electrode 1. The light 13 projected from the gate electrode is absorbed by each of the regions A, B, C, D, I and II of the a-Si:H(i) pattern protruding from the gate electrode (i.e., regions which are not overlapped by the gate electrode in accordance with an orthogonal view) pattern, which generates photo-carriers consisting of pairs of hole-electron. At this time, taking the potential distribution within the a-Si:H(i) layer in the direction parallel to the substrate (horizontal direction) into account, there exists almost no potential gradient in the horizontal direction in the parts I and II of the a-Si:H(i), which are superposed, respectively, on the source and the drain, i.e. the potential gradient is very soft there, and most of the applied voltage of $V_d = +10$ V is applied across the parts A, B, C and D between the source and the drain, i.e. the potential gradient is steep there. Consequently, even if photo-carriers are generated due to the absorption of light in the regions I and II, no carrier separation takes place, but almost all the photo-carriers disappear by recombination so that they don't contribute to the photo-current. On the other hand, photo-carriers generated in the regions A and D give rise to carrier separation because of the strong electric field so that electrons are absorbed by the drain electrode and holes flow into the regions B and C through the hole channel. As a result, the holes are recombined with electrons generated by the photo-carrier separation in the regions B and C. Remaining holes in the regions B and C are absorbed by the source electrode. In this case the photo-carriers generated in the regions A, B, C and D contribute to the photo-current. Further, the process, by which the holes, which have passed through the hole channel after the carrier separation, among the photo-carriers generated in the regions A and D are absorbed directly by the source electrode without passing through the regions B and C, contributes to the photo-current. That is, the regions A and B are photo-active regions in the applied voltage relation indicated in FIG. 5 and the regions B and C play the role to increase the photo-current. In the case where the relation between the voltages applied to the source and the drain electrodes indicated in FIG. 5 is inverted, the role of the regions A, D and I and that of the regions B, C and II are inverted so that the regions B and D are main photo-active regions and the photo-current is generated in the same way.

On the contrary, the regions I, II, E and F are photo-dead regions, which don't contribute to the photo-current for the following reason. FIG. 6 is a cross-sectional view of the TFT across the regions stated above for explaining the outline of the mechanism, by which the regions I, II, E and F don't contribute to the photo-current ($I_{ph}$). The voltages applied to the electrodes are identical to those described in the preceding example referring to FIG. 5. As clearly seen from FIG. 6, in the regions I and II there is almost no potential gradient in the horizontal direction, but it is very soft. Consequently, even if photo-carriers are produced within the semiconductor layer in these regions, most thereof disappear by recombination and don't contribute to the photo current. Further, in the regions E and F, similarly to the case of the regions I and II indicated in FIG. 6 stated above, there is almost no electric field parallel to the substrate and consequently these regions don't contribute to the photo-current.

FIG. 7 shows an example, for which variations in the photo-current are measured by applying $V_d= +10$ V to the drain electrode 4, 0 V to the source electrode 3, $V_g= -10$ V and $V_g= -20$ V to the gate electrode 1 in FIG. 1 and a spot light corresponding to 3000 lx is projected to the photo-active regions, while increasing the area of the irradiated photo-active regions in the order of A, A+B, A+B+D and A+B+D+C. As it can be understood from FIG. 7, in the case where $V_g= -10$ V and $V_g= -20$ V, the photo-current, when the TFT is turned off, increases almost linearly with increasing area of the photo-active regions.

As a result of this and in conjunction with that described above, it is possible to obtain TFTs, among which there are no defects wherein the photo-current undesirably increases, when the respective TFT is turned off, for the irradiation with light from the gate electrode side (called back light for the liquid crystal device), by constructing the TFT as indicated in FIGS. 1a and 2a, for which the photo-active regions A, B, C and D are removed from those indicated in FIGS. 3 and 4.

Concerning the cross-sectional structure of the TFT according to the present invention and that according to the prior art techniques, the cross-sectional views along the lines X-X' and Y-Y' in FIGS. 1a and 2a representing the TFTs according to the present invention are identical to those along the line X-X' in FIGS. 3 and 4 representing the TFTs according to the prior art technique, i.e. to those indicated in FIGS. 1b and 2b. However, according to the present invention, the cross-sectional structures are in the most part identical to those along the line Z-Z' in FIGS. 1a and 2a (FIGS. 1c and 2c), respectively. Consequently, increase in the stray capacitances and leak currents between the gate and the source and between the gate and the drain can be suppressed to a value as small as possible and gives rise to no problem.

It is matter of course that the effect of the TFT of the inverted staggered structure described above with respect to the suppression of photo-current is valid also for the TFT of staggered structure, in which the up and down relationship between the gate on the one side and the source and the drain on the other side is inverted, as far as it is irradiated with light from the gate side. At this time the plan structures thereof are identical to those indicated in FIGS. 1a and 2a. However, the cross-sectional views along the lines X-X' and Y-Y' are as indicated in FIG. 8a, while the cross-sectional view along the line Z-Z' is as indicated in FIG. 8b.

When the TFT according to the present invention is used as a switching element in an active matrix liquid crystal display, not only even if it is irradiated with a back light from the gate electrode side, which is as strong as about several thousands of lx, but also even if it is irradiated with a back light, which is as strong as about several ten thousands of lx, an increase in the photo-current, when the TFT is turned off, doesn't take place so that the intensity of the photo-current is below $10^{-11}$ A for a drain voltage of $V_d=10$ V and the value of the off level resistance can be kept above $10^{12}$ Ω. If this current intensity or this value of the resistance is maintained, characteristics for holding a brightness signal written in each of the pixel electrodes through the TFT from the drain electrode (signal line) become excellent and no deteriorations of the image quality such as unevenness in the brightness on the display screen, a decreases of contrast, etc. take place. In this way it is possible to obtain a liquid crystal display having a good image quality.

Next the liquid crystal display device according to the present invention comprises a plurality of data lines driven by data line driving means, a plurality of gate lines intersecting with the plurality of data lines stated above and driven by gate line driving means, a first substrate including a pixel electrode disposed at each of the intersecting portions of the data lines and the gate lines and a TFT driving the pixel electrode stated above, a second substrate including a conductive layer, and a liquid crystal layer disposed between the first and the second substrate stated above, the TFT stated above being a TFT according to the present invention described previously. It is possible to use a transparent material for the pixel electrode or conductive layer disposed on the second substrate.

BRIEF DESCRIPTION OF THE DRAWINGS

FIGS. 1a-1c show an example of the construction of the TFT according to the present invention, FIG. 1a being a plan view thereof, FIG. 1b being a cross-sectional view along the lines X-X' and Y-Y' in FIG. 1a, FIG. 1c being a cross-sectional view along the line Z-Z' in FIG. 1a;

FIGS. 2a-2c show an example of the construction of the main part of one pixel, in the case where the TFT according to the present invention is used in an active matrix type liquid crystal display device, FIG. 2a being a plan view thereof, FIG. 2b being a cross-sectional view along the lines X-X' and Y-Y' in FIG. 2a, FIG. 2c being a cross-sectional view along the line Z-Z' in FIG. 2a;

FIG. 8a is a cross-sectional view along the line X-X' in a TFT of staggered structure having the plan construction indicated in FIG. 2a;

FIG. 8b is a cross-sectional view along the line Z-Z' in the TFT of staggered structure having the plan construction indicated in FIG. 2a;

DESCRIPTION OF THE PREFERRED EMBODIMENTS

Figure 2A:
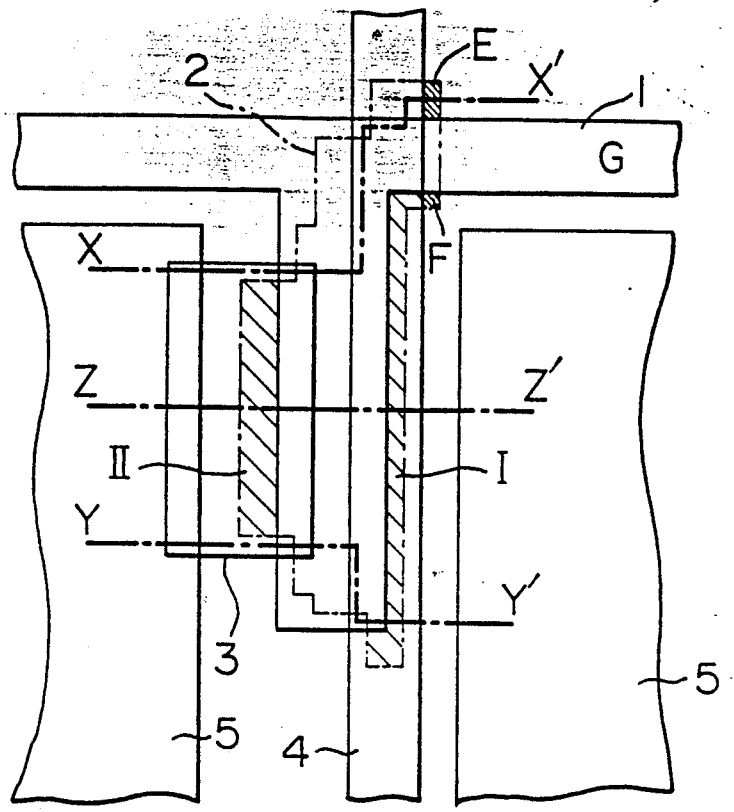
Figure 2B:
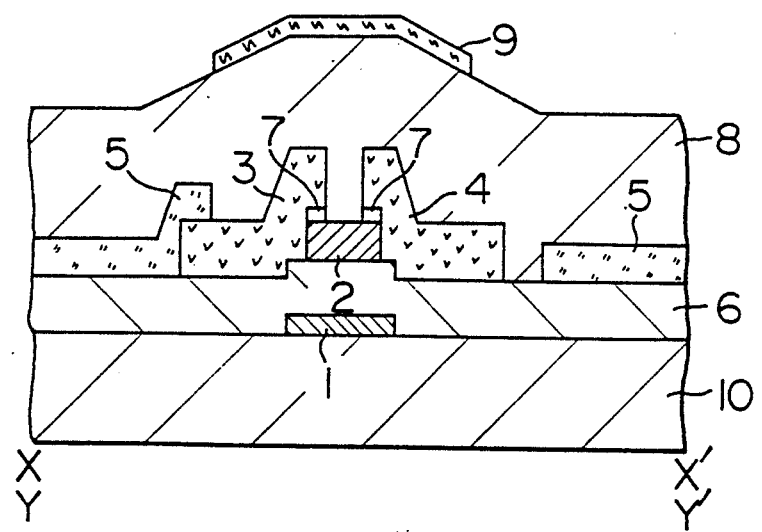
Figure 2C:
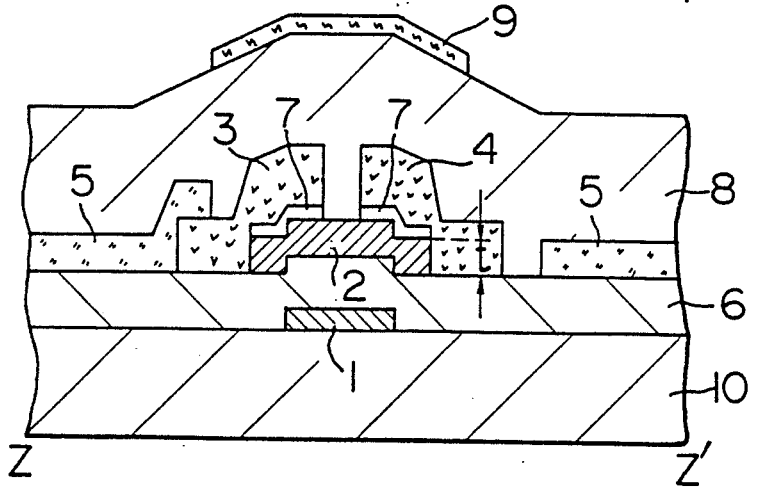

Embodiments of the TFT according to the present invention and the liquid crystal display panel using it will be explained more in detail, referring to FIGS. 2a, 2b and 2c.

A Cr layer is deposited on a transparent substrate 10 to a thickness of 100 nm by the sputtering method, which is formed into a gate electrode pattern 1 by the photo-etching method. Then an Al wiring 100 nm thick is formed on the Cr layer in the gate wiring portion, in order to reduce the resistance of the gate wiring. Further an SiN gate insulating layer 6, an a-Si:H(i) layer 2 and an a-Si:H(n+) layer 7 are deposited successively by the plasma CVD method to thicknesses of 300 nm, 200 nm and 400 nm, respectively. The a-Si:H(i) and the a-Si:H(n+) layers are formed by the photo-etching method into island-shaped patterns 2 and 7, respectively. At this time each of the a-Si:H(i) and (n+) patterns 2 and 7 has at least a part thereof protruding outward from the gate electrode 1 in the plan construction, as indicated in FIG. 2a, and the a-Si:H(i) pattern between the source and the drain electrodes is formed over the gate electrode 1 and under and inside the source electrode 3 and the drain electrode 4. Then a Cr/Al double layer is deposited by the sputtering method to thicknesses of 60 nm and 300 nm, respectively, and a pattern for the source electrode 3 and the drain electrode 4 is formed by the photo-etching method. Then the a-Si:H(n+) layer at the channel portion is removed by using the source and the drain electrodes as a mask (7 in FIGS. 2b and 2c). Next a transparent ITO (Indium Tin Oxide) electrode 120 nm thick is deposited by the sputtering method and it is formed into a pixel electrode pattern 5 by the photo-etching method. Thereafter an SiN protecting layer 1 μm thick is deposited by the plasma CVD method. Further an Al light intercepting pattern 9 100 nm thick is formed. At this time the cross-sections along the lines X-X' and Y-Y' are as indicated in FIG. 2b and that along the line Z-Z' is as indicated in FIG. 2c.

Figure 9:
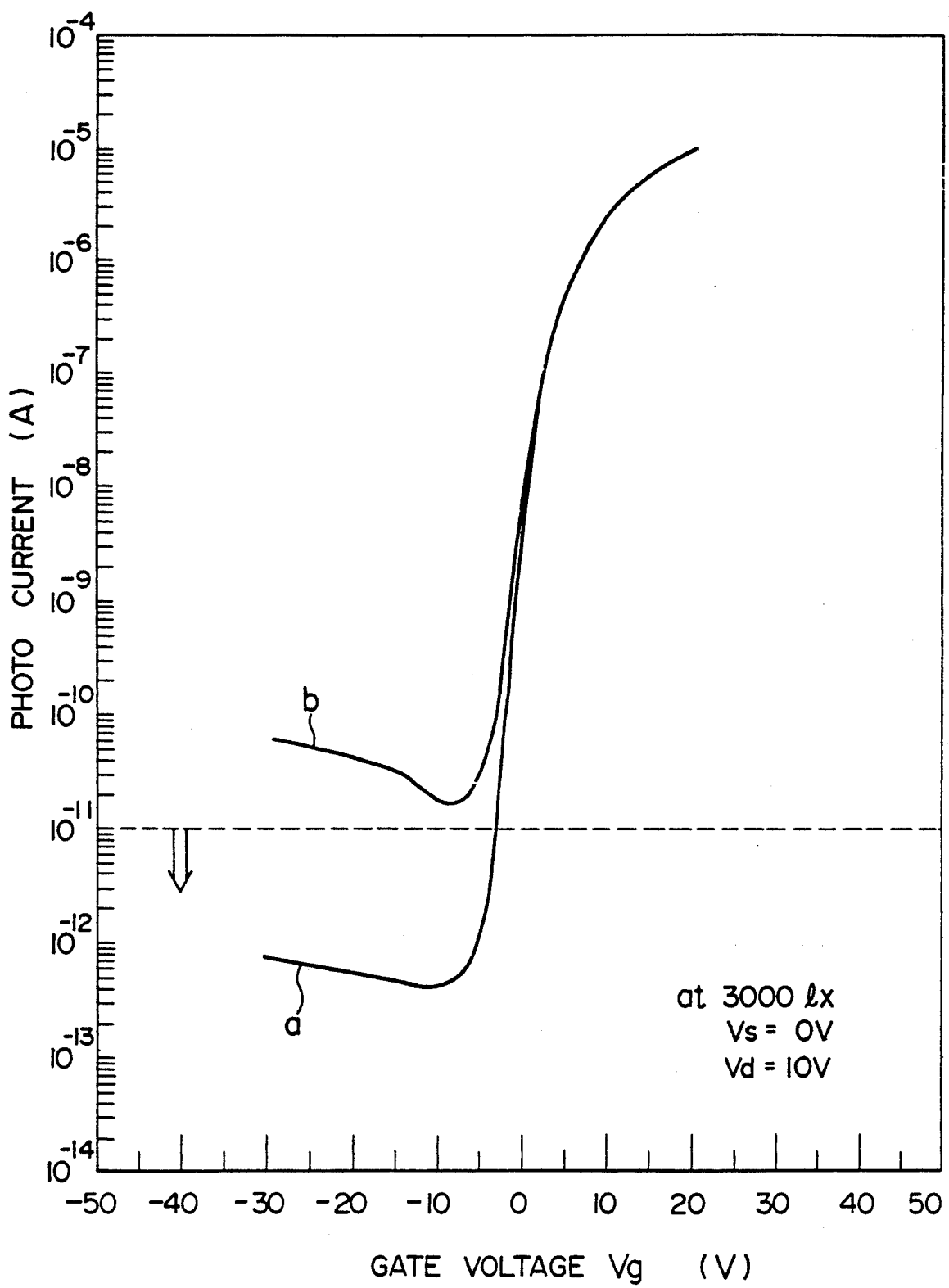
FIG. 9 is a graph illustrating an example of the comparison of the photo-current (curve a) flowing through the TFT according to the present invention, when it is turned off, with the photo-current (curve b) flowing through the TFT according to the prior art techniques, when it is turned off.

The TFT described above according to the present invention is irradiated with back light of 3000 lx from the gate electrode side and transfer characteristics thereof are measured with a source voltage of $V_s=0$ V and a drain voltage of $V_d=+10$ V. As the result a curve (a) in FIG. 9 representing variations in the photo-current, when the TFT is turned off, is obtained. The curve satisfies the condition that the intensity of the off level current is below $10^{-11}$ A, which is the required value. When it is compared with the curve (b) in FIG. 9 representing the off level photo-current in the transfer characteristics of the prior art TFT having photo-active regions, an improvement of about 2 orders of magnitude can be confirmed.

Figure 10:
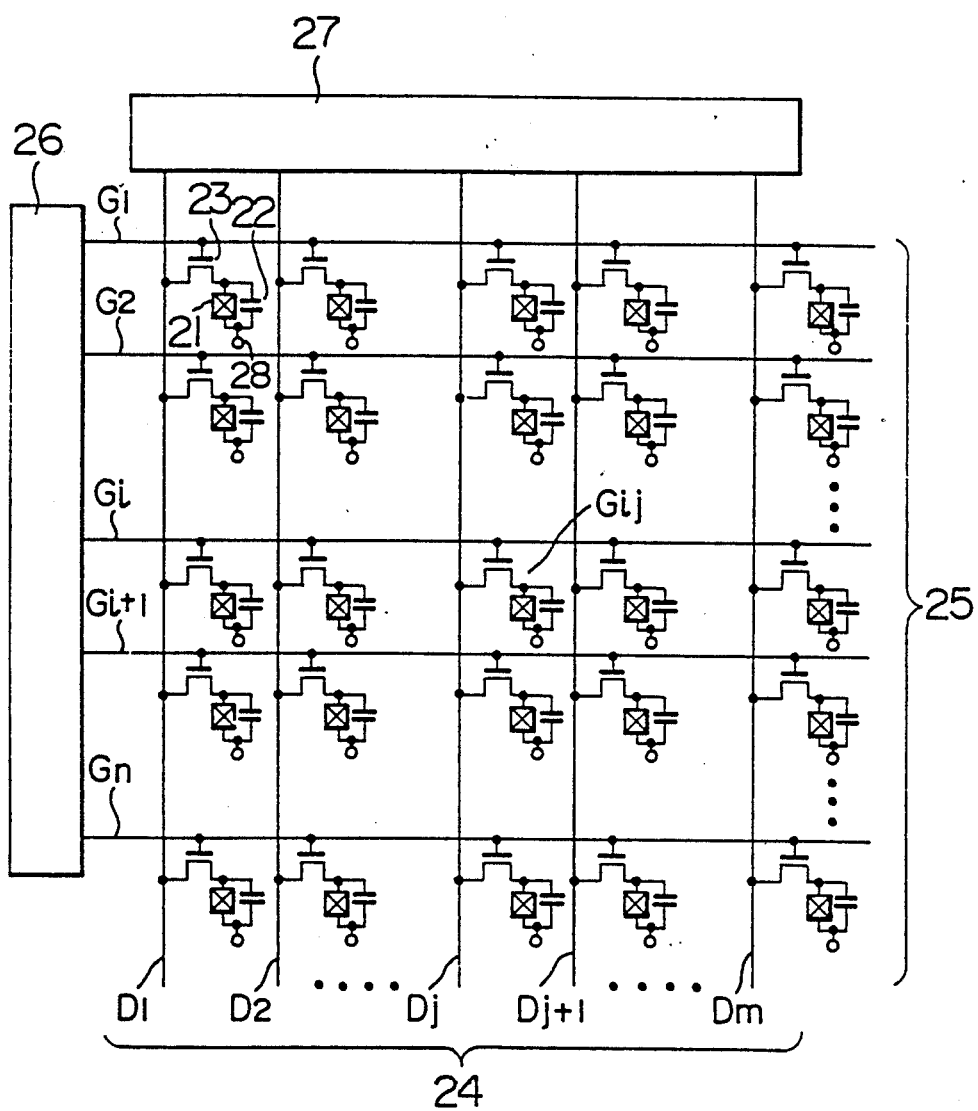
FIG. 10 shows an example of the circuit construction of the liquid crystal display device according to the present invention.

Now a liquid crystal display device using the TFT according to the present invention described previously will be explained. FIG. 10 shows an example of the circuit construction of the liquid crystal display device according to the present invention.

In the figures, reference numeral 21 represents liquid crystal cells disposed in a matrix; 22 condensors for storing electric charge; and 23 TFTs, each of which is connected with an electrode of each of the liquid crystal cells 21, each of them constituting a pixel. 24 represents a plurality of (m) data lines $D_1-D_m$ each of which is connected in common with the data electrodes of TFTs belonging to each of the rows of the active matrix and 25 represents a plurality of (n) gate lines $G_1-G_n$, each of which is connected in common with the gate electrodes of TFTs belonging to each of the lines of the active matrix. Further, 26 is a scanning circuit applying scanning pulses to the gate lines one after another and 27 is a scanning circuit applying image signals corresponding to a horizontal scanning to the data lines in parallel. 28 indicates a common electrode, which is formed on a substrate opposite to the substrate, on which the TFTs are formed, through a liquid crystal layer. This common electrode is formed in the form of an electrode disposed on the whole surface of the opposite base plate and each portion thereof, which is opposite to each of the pixels in the liquid crystal cells 21 serves as the other electrode of the relevant cell.

In the liquid crystal display device according to the present invention, the TFT stated above is the TFT according to the present invention described previously Since in the liquid crystal display device according to the present invention increase in the photo-current, when the TFT is turned off, doesn't take place, it is possible to obtain a liquid crystal display of high image quality.

Figure 1A:
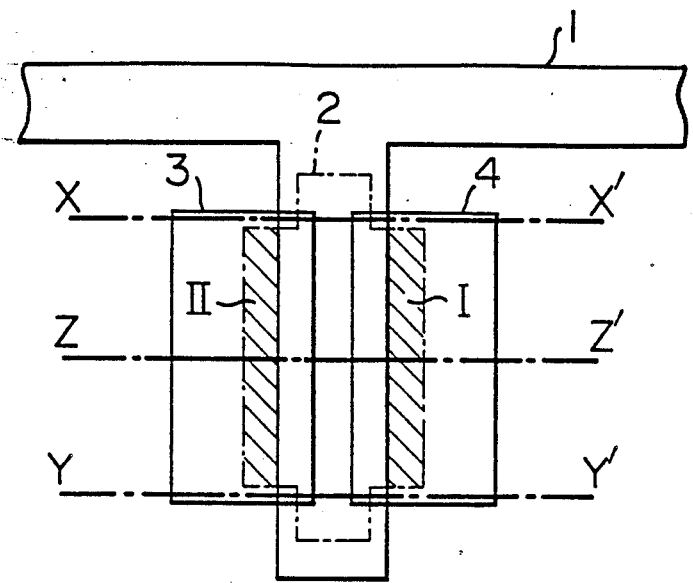
Figure 1B:
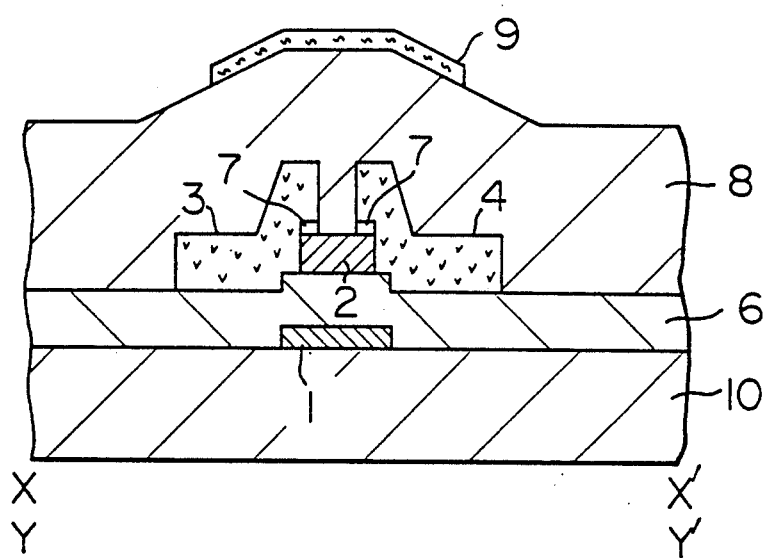
Figure 1C:
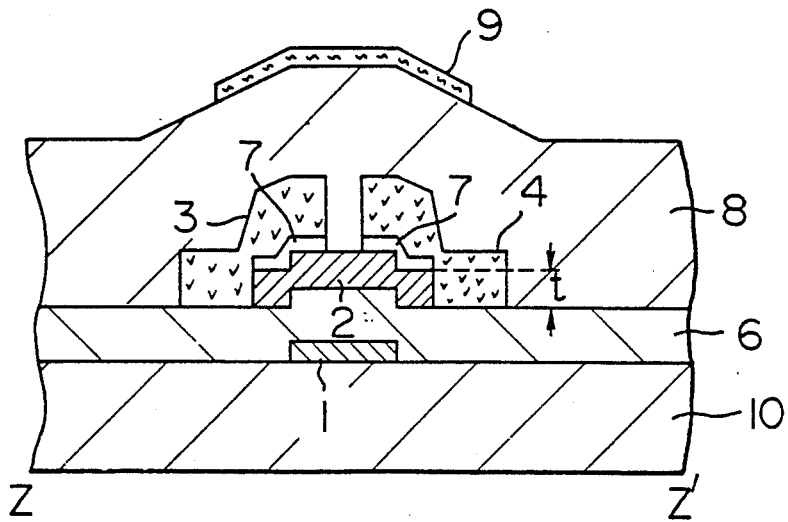

Now a modified embodiment of the TFT according to the present invention will be explained. A TFT having a plan view, as indicated in FIG. 1a, is fabricated by a method similar to that used for the preceding embodiment. At this time the cross-sectional views along the lines X-X' and Y-Y' in FIG. 1a are as indicated in FIG. 1b and the cross-sectional view along Z-Z' is as indicated in FIG. 1c.

In the TFT having this construction increase in the photo-current generated by irradiation with light from the gate electrode side, when the TFT is turned off, doesn't take place, just as described for Embodiment described above.

Figure 8A:
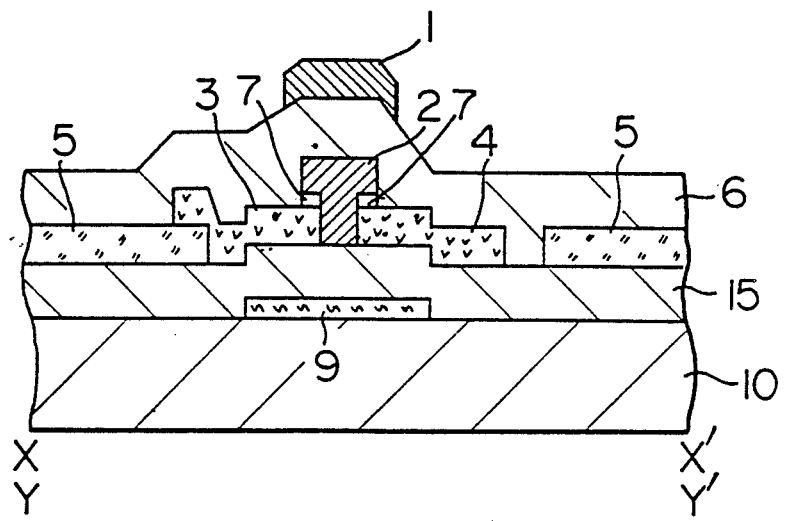
Figure 8B:
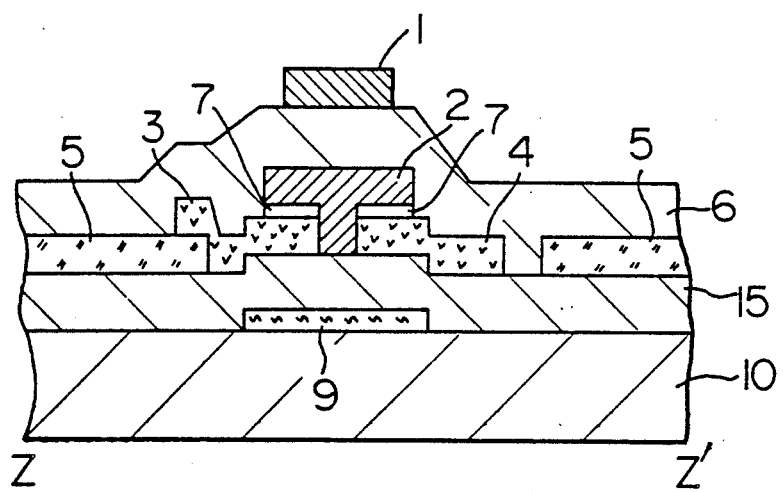

Another embodiment of the TFT according to this embodiment will be explained, referring to FIGS. 2a, 8a and 8b. This embodiment is an example of the TFT of staggered structure.

A Cr light intercepting layer pattern 9 100 nm thick is formed on a transparent base plate 10 and an SiO₂ underlayer 15 400 nm thick is deposited by the plasma CVD method. Then an ITO layer 100 nm thick is deposited by the sputtering method, which layer is formed into a pixel electrode pattern 5 by the photo-etching method. Next an Al/Cr double layer is deposited by the sputtering method to thicknesses 100 nm and 60 nm, respectively, and then an a-Si:H(n+) layer 50 nm thick is deposited by the plasma CVD method. Thereafter the a-Si:H(n+) and the Al/Cr double layer are patterned into the source electrode 3 and the drain electrode 4 by the photo-etching method. After that, an a-Si:H(i) layer is deposited by the photo-etching method, which layer is formed into island-shaped pattern of a-Si:H(i) 2 and a-Si:H(n+) 7 having the shape satisfying FIGS. 2a, 8a and 8b by the photo-etching method. Then an SiN gate insulating layer 6 300 nm thick is deposited by the plasma CVD method. Next a Cr/Al double layer is deposited by the sputtering method to thicknesses 100 nm and 200 nm, respectively, which layer is formed into the gate electrode pattern 1 by the photo-etching method. The TFT having cross-sections indicated in FIGS. 8a and 8b is called generally TFT of staggered structure. In the case where the TFT having this cross-sectional structure has the plan construction indicated in FIG. 2a; the cross-sectional views along the lines X-X' and Y-Y' in FIG. 2a is as indicated in FIG. 8a; and the cross-sectional view along Z-Z' has the construction as indicated in FIG. 8b, wherein an increase in the photo-current generated by irradiation with light from the gate electrode side does not take place.

Figure 3:
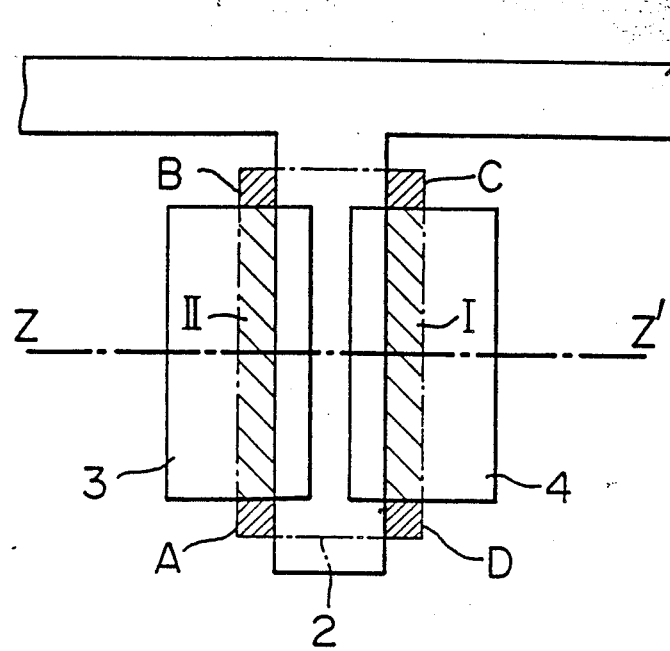
FIG. 3 shows an example of the plan construction of the TFT according to the prior art techniques.
Figure 4:
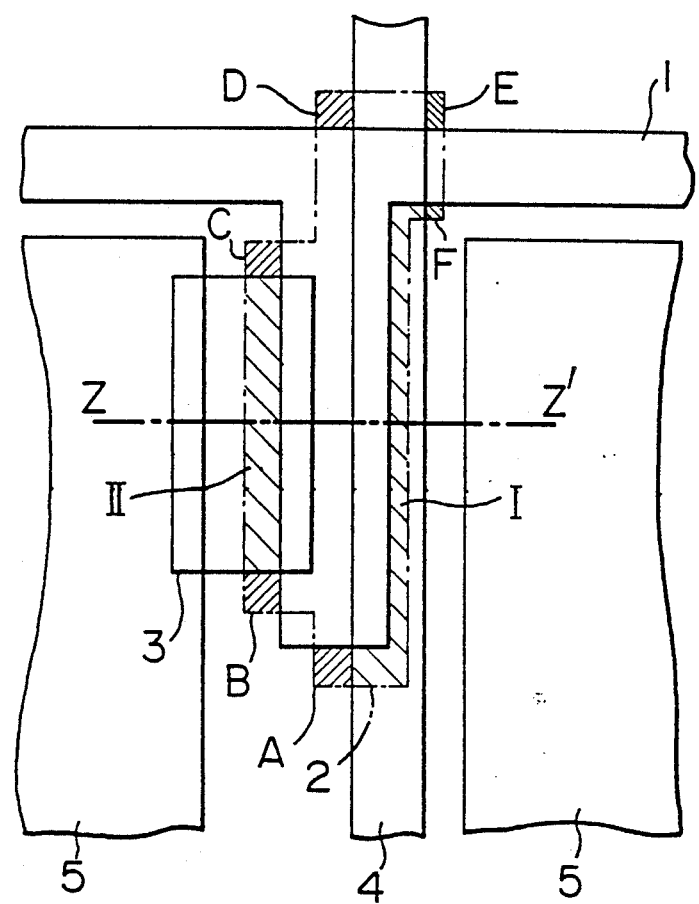
FIG. 4 shows an example of the plan construction of the main part of one pixel, in the case where the TFT according to the prior art techniques is used in an active matrix type liquid crystal display device.
Figure 5:
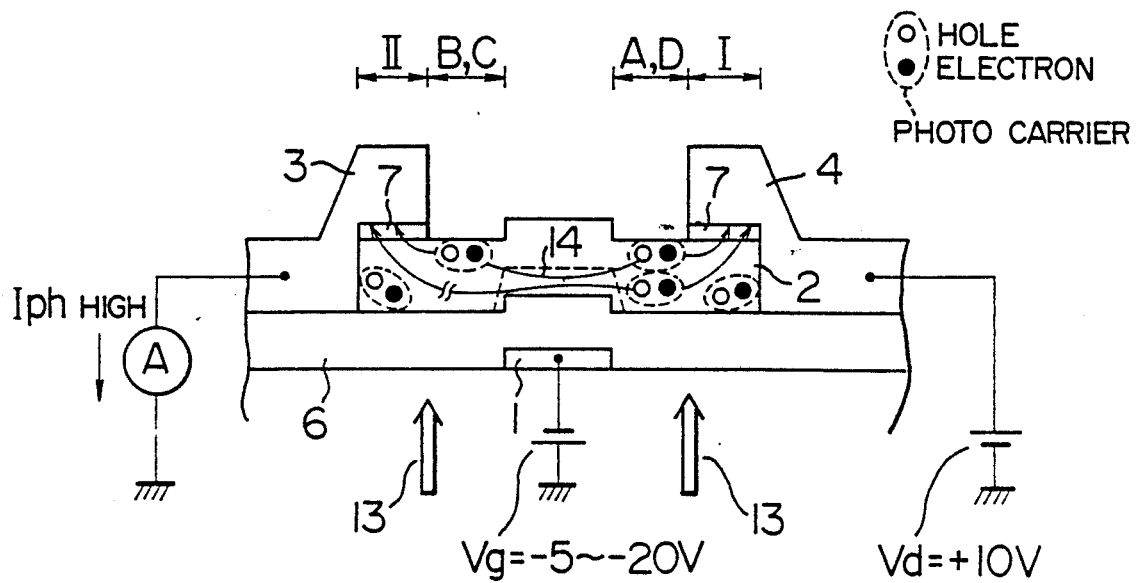
FIG. 5 is a scheme illustrating the mechanism of generation of the photo-current in photo-active regions A, B, C and D.
Figure 6:
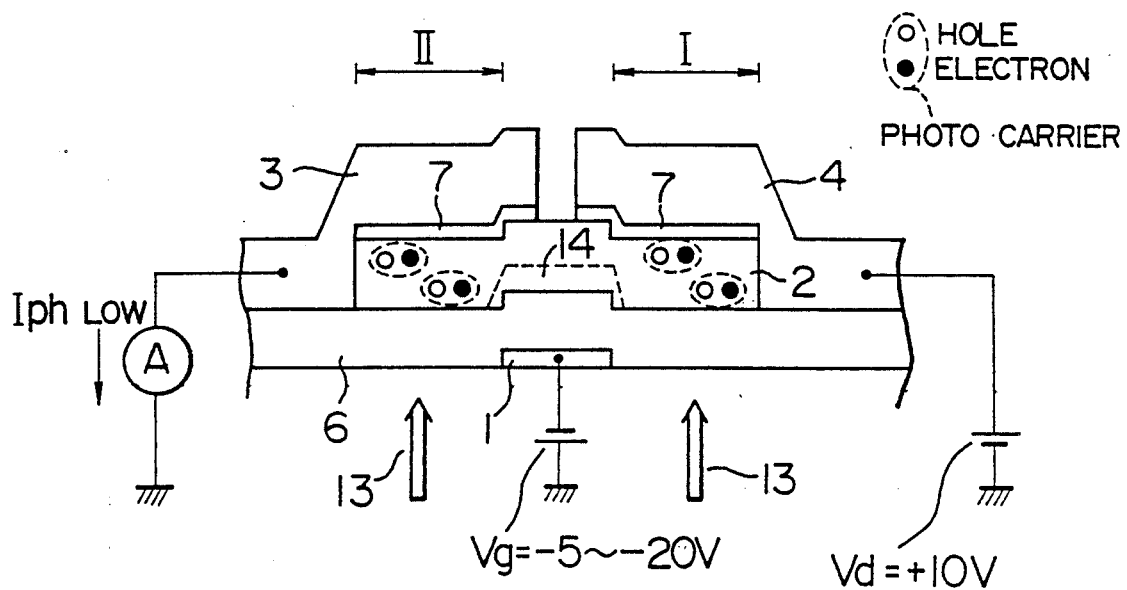
FIG. 6 is a scheme illustrating the mechanism, by which no photo-current is generated in photo-dead regions I and II.
Figure 7:
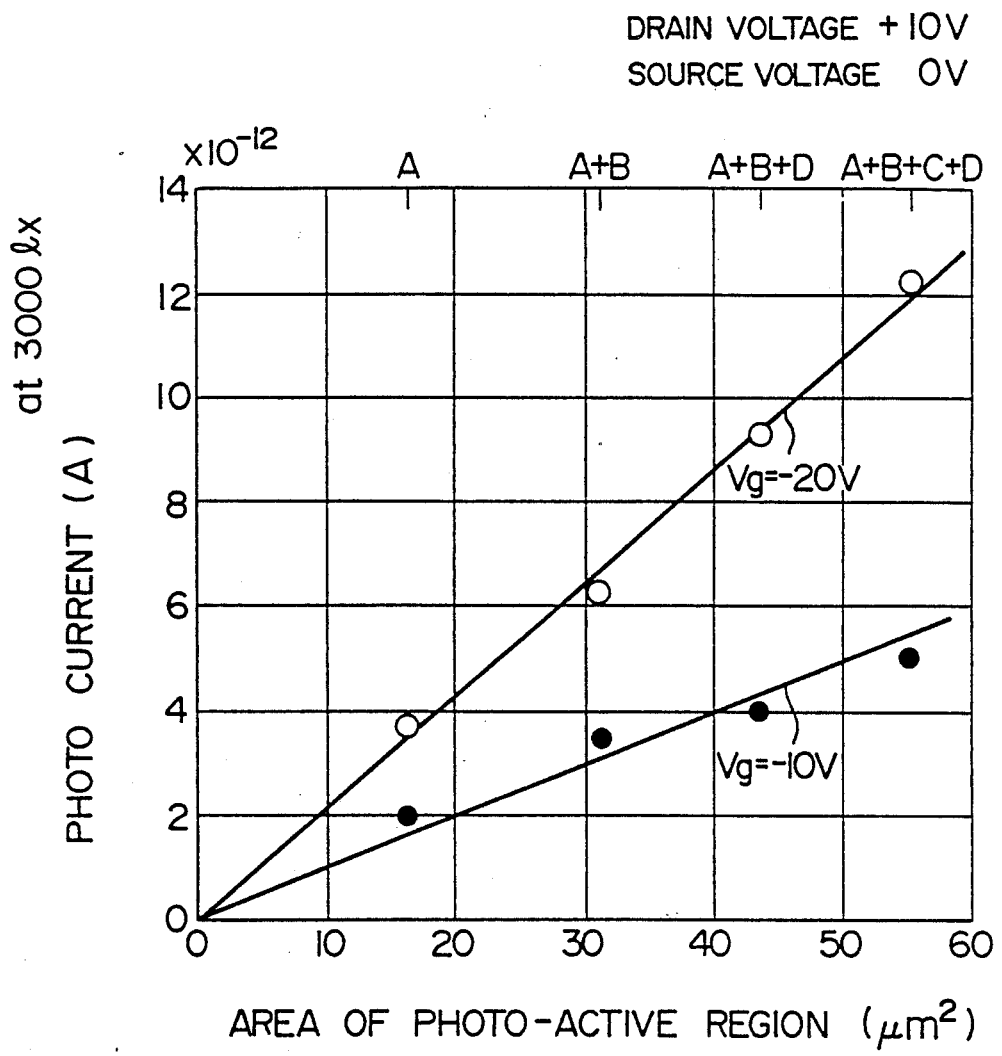
FIG. 7 is a graph indicating the relation between the area of the photo-active regions and the intensity of the photo-current.

As explained above, in the TFT according to the present invention, there exist no photo-active regions, where photo-current is generated by irradiation with light, and therefore the photo-current, when the TFT is turned off, can be kept below $10^{-11}$ A, for example. Furthermore, increase in the stray capacitance and the leak current between the gate on one side and the source and the drain on the other side, which is a drawback of TFTs having constructions indicated in FIGS. 3 and 4, give rise to no problems.

Since the active matrix liquid crystal display constructed by the TFT according to the present invention gives rise to no increase in the photo-current, when the TFT is turned off, even if it is irradiated with a strong back light from the gate electrode side, it is possible to keep the off resistance above $10^{12}$ Ω and thus characteristics for holding the brightness signal written in each of the pixels are improved. In this way unevenness in the brightness on the display screen, etc. does not take place and it is possible to obtain a display image of high quality.

We claim:
1. A thin film transistor comprising:
   a substrate;
   a gate insulating layer;
   a source electrode; and
   a drain electrode,
   wherein said semiconductor layers and said gate electrode are disposed in an overlapping arrangement, with respect to a plan view thereof, and are separated via said gate insulating layer, said semiconductor layer being dimensioned to have an area with respect to said plan view thereof greater than an area of said gate electrode, said gate electrode of said overlapping arrangement being insulatedly overlapped by said semiconductor layer and overlapped by said source and drain electrode, and
   wherein at least one of said source and drain electrodes is disposed to cover an area of said semiconductor layer corresponding to a portion thereof not overlapped by said gate electrode, with respect to said plan view.

2. A thin film transistor according to claim 1, wherein said semiconductor layer is a semiconductor layer made of hydrogenated amorphous silicon.

3. A thin film transistor according to claim 1, wherein said transistor has an inverted staggered structure, in which said gate electrode is disposed over said substrate, said gate insulating layer is disposed over said gate electrode and said semiconductor layer is disposed over said gate insulating layer.

4. A thin film transistor according to claim 1, wherein an intensity of the off level current thereof is lower than $10^{-11}$ A, even if said transistor is irradiated with light.

5. A thin film transistor comprising:
   a substrate;
   a gate electrode;
   a gate insulating layer;
   a semiconductor layer;
   a source electrode; and
   a drain electrode,
   wherein said semiconductor layer and said gate electrode are disposed in an overlapping arrangement, with respect to a plan view thereof, and are separated via said gate insulating layer, said semiconductor layer is dimensioned to have an area greater than an area of said gate electrode insulatedly overlapped by said semiconductor layer and overlapped by said source and drain electrodes and said semiconductor layer is dimensioned such that it remains effectively free from the affects of any applied electric field in a direction parallel to said substrate.

6. A thin film transistor comprising:
   a substrate;
   a gate electrode;
   a gate insulating layer;
   a semiconductor layer;
   a source electrode; and
   a drain electrode;
   wherein said semiconductor layer and said gate electrode are disposed in an overlapping arrangement, with respect to a plan view thereof, and are separated via said gate insulating layer, said semiconductor layer is dimensioned to have an area greater than an area of said gate electrode insulatedly overlapped by said semiconductor layer and overlapped by said source and drain electrodes, and
   wherein the area of said semiconductor layer is dimensioned such that a portion thereof producing photo-carriers and which photo-carriers would be subjected to carrier separation in response to an applied electric field remains shielded from the electric field.

7. A thin film transistor according to claim 6, wherein said semiconductor layer is a semiconductor layer made of hydrogenated amorphous silicon.

8. A thin film transistor according to claim 6, wherein said transistor has an inverted staggered structure, in which said gate electrode is disposed over said substrate, said gate insulating layer is disposed over said gate electrode and said semiconductor layer is disposed over said gate electrode through said gate insulating layer.

9. A thin film transistor according to claim 6, wherein the intensity of the off level current thereof is lower than $10^{-11}$ A, even if said transistor is irradiated with light.

10. A liquid crystal display device comprising:
a plurality of data lines driven by data lines driving means;
a plurality of gate lines intersecting with said plurality of data lines and driven by gate line driving means;
a first substrate including a pixel electrode disposed at each of the intersecting portions of said data lines and said gate lines and a thin film transistor driving said pixel electrode;
a second substrate including a conductive layer; and
a liquid crystal layer disposed between said first and said second substrate,
wherein said thin film transistor includes a gate electrode, a gate insulating layer, a semiconductor layer, a source electrode, and a drain electrode, which are disposed on a predetermined substrate, wherein said semiconductor layer and said gate electrode are disposed in an overlapping arrangement, with respect to a plan view thereof, and are separated via said gate insulating layer, said semiconductor layer is dimensioned to have an area greater than an area of said gate electrode insulatedly overlapped by said semiconductor layer and overlapped by said source and drain electrodes, and said semiconductor layer is dimensioned such that it remains effectively free from the affects of any applied electric field in a direction parallel to said substrate.

11. A liquid crystal display device having a thin film transistor according to claim 10, wherein said semiconductor layer is a semiconductor layer made of hydrogenated amorphous silicon.

12. A liquid crystal display device having a thin film transistor according to claim 10, wherein said transistor has an inverted staggered structure, in which said gate electrode is disposed over said substrate, said gate insulating layer is disposed over said gate electrode and said semiconductor layer is disposed over said gate electrode through said gate insulating layer.

13. A liquid crystal display device having a thin film transistor according to claim 10, wherein an intensity of the off level current thereof is lower than $10^{-11}$ A, even if said transistor is irradiated with light.

14. A liquid crystal display device having a thin film transistor according to claim 10, wherein said electric field parallel to said substrate has such an intensity that photo-carriers generated in said semiconductor layer are subjected to carrier separation.

15. A liquid crystal display device having a thin film transistor according to claim 10, wherein said pixel electrode is transparent.

16. A liquid crystal display device having a thin film transistor according to claim 10, wherein said conductive layer is transparent.

17. A thin film transistor according to claim 1, wherein said source and drain electrodes are disposed to cover respective areas, with respect to said plan view, corresponding to opposing portions of said semiconductor layer which are not overlapped by said gate electrode, said portions combined with the portion of said semiconductor layer overlapped by both said source and drain electrodes and said gate electrode corresponds to an area of said semiconductor layer greater than that of said gate electrode.

18. A thin film transistor according to claim 17, wherein said semiconductor layer is disposed insulatedly above said gate electrode, said gate electrode being formed on said substrate, and said substrate being a transparent substrate.

19. A thin film transistor according to claim 1, wherein said semiconductor layer is disposed insulatedly above said gate electrode, said gate electrode being formed on said substrate, and said substrate being a transparent substrate.

20. A thin film transistor according to claim 2, wherein an intensity of the off level current thereof is lower than $10^{-11}$ A, even if said transistor is irradiated with light.

* * * * *